(12) United States Patent
Kahn et al.

(10) Patent No.: US 6,886,105 B2
(45) Date of Patent: *Apr. 26, 2005

(54) METHOD AND APPARATUS FOR RESUMING MEMORY OPERATIONS FROM A LOW LATENCY WAKE-UP LOW POWER STATE

(75) Inventors: Opher Kahn, Haifa (IL); Doron Orenstein, Haifa (IL)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/504,003

(22) Filed: Feb. 14, 2000

(65) Prior Publication Data

US 2003/0188212 A1 Oct. 2, 2003

(51) Int. Cl.$^7$ .................................................. G06F 1/32
(52) U.S. Cl. .................. 713/323; 710/104; 711/105; 713/300
(58) Field of Search .............................. 713/300, 323; 711/105; 710/104

(56) References Cited

U.S. PATENT DOCUMENTS

| | | | |
|---|---|---|---|
| 4,224,506 A | | 9/1980 | Coppola et al. |
| 4,236,207 A | | 11/1980 | Rado et al. |
| 4,994,934 A | | 2/1991 | Bouhenguel |
| 5,263,168 A | | 11/1993 | Toms et al. |
| 5,692,204 A | * | 11/1997 | Rawson et al. ............. 713/340 |
| 5,713,006 A | | 1/1998 | Shigeeda |
| 5,721,937 A | * | 2/1998 | Kurihara et al. ............ 713/323 |
| 5,757,365 A | | 5/1998 | Ho |
| 6,003,121 A | | 12/1999 | Wirt |
| 6,055,643 A | * | 4/2000 | Chaiken ....................... 713/323 |
| 6,112,306 A | * | 8/2000 | Volk et al. ................... 713/323 |
| 6,128,747 A | * | 10/2000 | Thoulon ....................... 713/330 |
| 6,173,345 B1 | * | 1/2001 | Stevens ....................... 711/100 |
| 6,226,729 B1 | * | 5/2001 | Stevens et al. ............. 711/171 |
| 6,230,274 B1 | * | 5/2001 | Stevens et al. ............. 713/320 |
| 6,272,642 B1 | * | 8/2001 | Pole, II et al. .............. 713/300 |
| 6,330,639 B1 | * | 12/2001 | Fanning et al. ............. 711/106 |
| 6,378,056 B1 | * | 4/2002 | Nizar et al. ................. 711/170 |
| 6,438,668 B1 | * | 8/2002 | Esfahani et al. ............ 711/165 |
| 6,546,343 B1 | * | 4/2003 | Batra et al. ................... 702/64 |
| 6,571,333 B1 | * | 5/2003 | Jain et al. ....................... 713/2 |

OTHER PUBLICATIONS

Rambus Advance Information—Direct RAC Data Sheet date Aug. 7, 1998.
Rambus Advance Information—Direct Rambus RIMM Module 128 MBytes (64Mx 16/18) dated Aug. 20, 1998.
Rambus Advance Information—Direct RMC.d1 Data Sheet dated Aug. 7, 1998.
Rambus Advance Information—Direct RDRAM 64/72–Mbit (256Kx16/18x16d) Datasheet dated Aug. 3, 1998.
Rambus Advance Information– RIMM Serial Presence Detect Application Note dated Oct. 9, 1997.
Rambus, Inc., "Direct Rambus Memory for Mobile PCs," URL http://www.rambus.com/html/partners.html/, May 1998, pp. 1–5.

* cited by examiner

Primary Examiner—Rehana Perveen
Assistant Examiner—Eric Chang
(74) Attorney, Agent, or Firm—Thomas R. Lane

(57) ABSTRACT

A method and apparatus for resuming operations from a low latency wake-up low power state. One embodiment provides a system including a processor, an operating system, and a memory subsystem that requires initialization commands to exit a memory low power state. Control logic detects exit from an operating system low latency low power state and responsively generates a plurality of initialization commands to remove the memory subsystem from the memory low power state prior to deasserting a stop clock signal and allowing execution to resume.

31 Claims, 3 Drawing Sheets

METHOD AND APPARATUS FOR RESUMING MEMORY OPERATIONS FROM A LOW LATENCY WAKE-UP LOW POWER STATE

BACKGROUND

1. Field

The present disclosure pertains to the field of power management for a processing system and particularly to resuming operations upon exiting a low power state.

2. Description of Related Art

Power management is an increasingly important feature in systems such as computer systems. However, users are generally less interested in power conservation features that significantly impact the response time and performance of their systems. Thus, implementing low power states with low latency resumption is desirable.

The Advanced Configuration and Power Interface (ACPI) Specification 1.0b provides a uniform set of definitions, power management states, and the like for implementing power conservation features in a computing system. The ACPI Specification defines the S1 power state as a low latency power state in which all system context is maintained (see §9.1.1).

A typical system arrangement asserts the STPCLK# pin and waits for the processor to enter the stop grant state. At this point, the system may or may not shut down clocks to the processor and/or to external buses or other circuitry. Prior art systems place system memory into a self-refresh or a suspend-refresh state. Refresh is maintained by the memory itself or through some other reference clock that is not stopped during the sleeping (S1) state.

One example of a memory architecture is the Rambus® technology available from Rambus Corporation of Mountain View, Calif. Some Rambus® memories offer various power conservation modes (see "Direct Rambus™ Memory for Mobile PCs" also available from Rambus Corporation). Active, nap, standby, and PwrDown (powerdown) modes are available. An RDRAM® device automatically transitions to standby mode at the end of a transaction. When a memory transaction request is sent out to the memory array, the appropriate RDRAM® device exits standby and services the request.

Power consumption may be further reduced by placing RDRAM® devices in a nap mode or a powerdown mode. Nap and powerdown modes may be entered by sending commands to the memory. From both the nap mode and the powerdown mode, a resynchronization time is required by the RDRAM® devices for memory system's delay locked loop to synchronize the interface to the channel clock.

Unfortunately, these memory power conservation states do not directly map into power conservation states enumerated by the ACPI Specification. The system designer is left to determine which states to use at what time, and how to enter and exit such states. Particularly puzzling is how to perform re-initialization in such a memory architecture when exiting low latency states such as the ACPI S1 state where nap or powerdown memory power conservation modes are likely to be used.

When exiting nap and powerdown states, the memory requires clock re-initialization. Exiting the ACPI S1 state, however, typically results in returning directly to operating system code (in the memory subsystem) after deassertion of the STPCLK# interrupt. Accordingly, it may not be possible to execute low level software such as BIOS software in response to a transitions out of the S1 state. Consequently, the memory subsystem may not be sufficiently re-initialized to allow memory accesses to commence.

BRIEF DESCRIPTION OF THE FIGURES

The present invention is illustrated by way of example and not limitation in the figures of the accompanying drawings.

DETAILED DESCRIPTION

The following description provides a method and apparatus for resuming operations from a low latency wake-up low power state. In the following description, numerous specific details such as memory types, signal names and logic partitioning/integration choices are set forth in order to provide a more thorough understanding of the present invention. It will be appreciated, -however, by one skilled in the art that the invention may be practiced without such specific details. In other instances, control structures and gate level circuits have not been shown in detail in order not to obscure the invention. Those of ordinary skill in the art, with the included descriptions, will be able to implement appropriate logic circuits without undue experimentation.

Some embodiments advantageously allow initialization sequences to be performed in conjunction with exiting low latency low power states. This initialization may be important to ensure proper operation of memory subsystems that have complex initialization requirements. Some embodiments perform such initialization using hardware to avoid any reliance on the memory subsystem as the memory subsystem may not yet be operational. Likewise, some embodiments perform the initialization operations in a manner transparent to the operating system and/or to the central processor.

Figure 1:
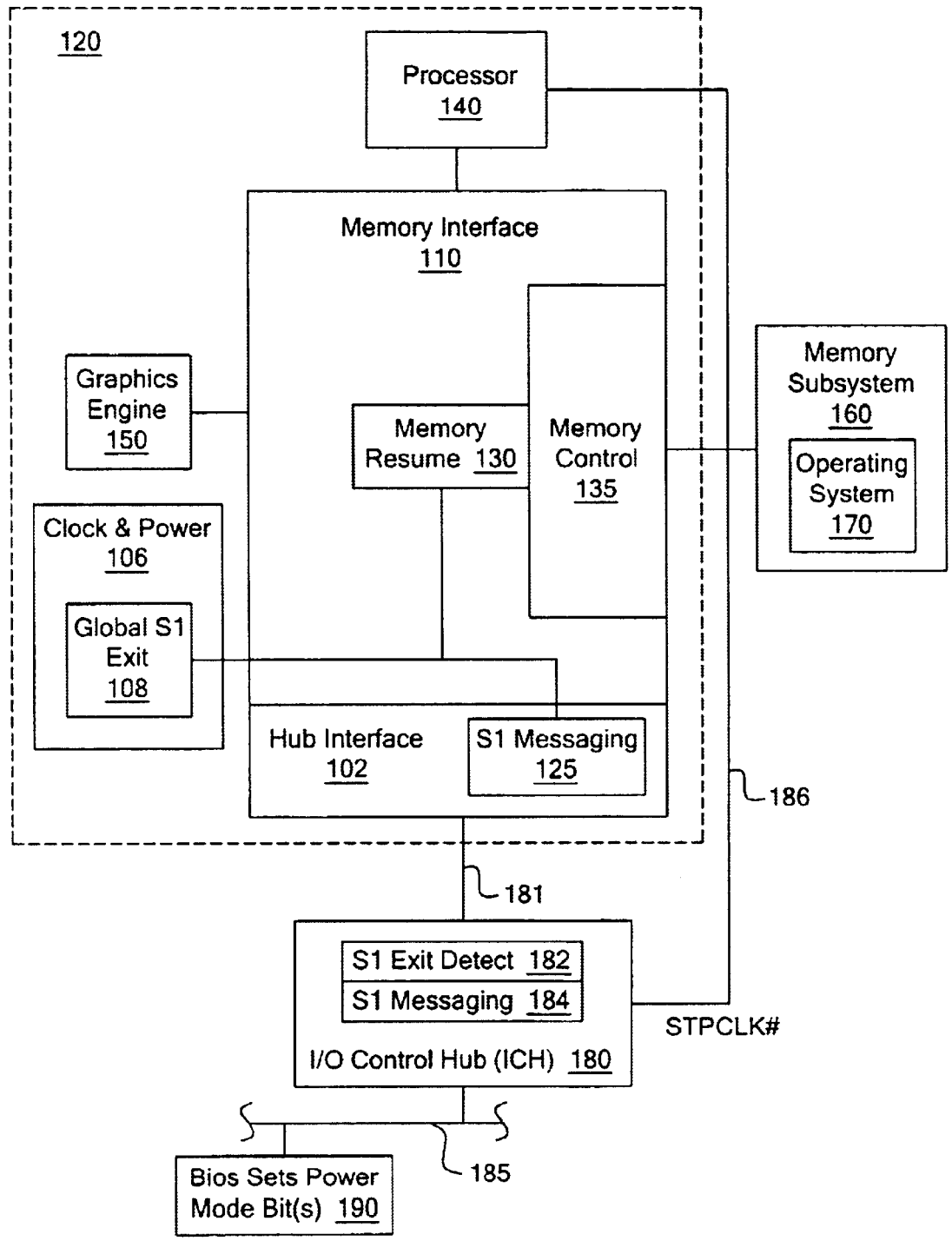
FIG. 1 illustrates one embodiment of a system utilizing presently disclosed techniques.

FIG. 1 illustrates one embodiment of a system utilizing presently disclosed techniques. The system of FIG. 1 includes a memory interface 110 and a hub interface 102 which are coupled to a processor 140 and a graphics engine 150. As indicated by a dashed box 120, the processor 140, the memory interface 110, the hub interface 102 and the graphics engine 150 may be integrated into a single component. Also within the component is a clock and power unit 106 which may control global clocking a power supply for the memory interface 110, the processor 140, and the graphics engine 150. The memory interface 110 is also coupled to a memory subsystem 160. The memory subsystem 160, when the system is operational, contains an operating system 170. The hub interface 102 is coupled to an I/O control hub (ICH) 180. The ICH 180 is coupled to generate a stop clock signal (STPCLK#) on a signal line 186 for the processor 140. The ICH 180 is also coupled to a secondary bus 185 which has coupled thereto a memory device 190 storing BIOS routines.

The embodiment of FIG. 1 utilizes logic in both the ICH 180 and the memory interface 110 to exit from a low latency low power state and to appropriately initialize a memory subsystem 160 so that execution may be resumed. Accordingly, the memory subsystem 160, the operating system 170 and the processor 140 need not be involved.

Figure 2:
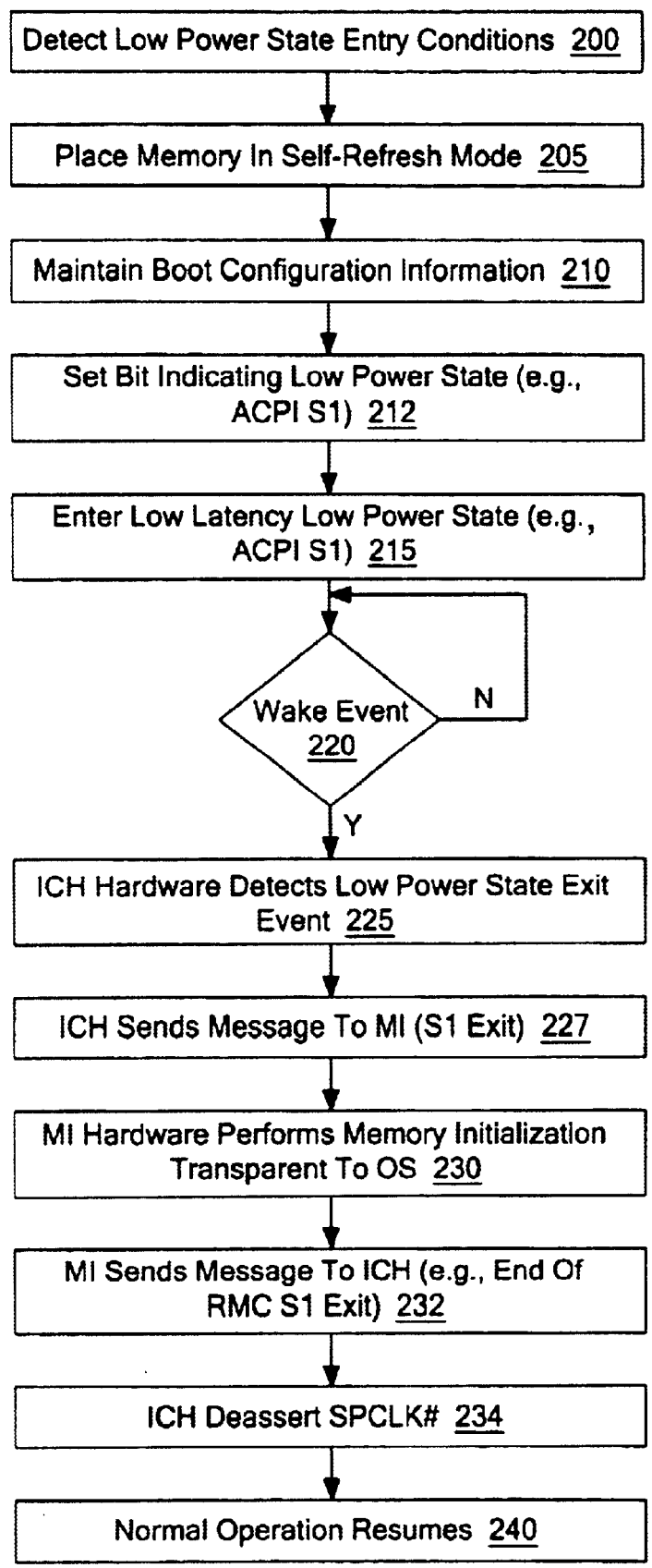
FIG. 2 is a flow diagram for operations of one embodiment of the system of FIG. 1.

The operation of one embodiment of the system illustrated in FIG. 1 is illustrated in the flow diagram of FIG. 2. In block 200, low power state entry conditions are detected. Detecting conditions such as inactivity or low battery power which warrant the entry into a low power state may be performed by hardware, software, or combination of both. Known or otherwise available techniques may be used to do so. Additionally, a user request such as a shutdown command, a special power button, a hot key, or keyboard or lid closure may trigger low power state entry. Once it is determined that a low power state should be entered, the system also typically selects which of a set of low power states to enter. For example, the ACPI specification describes low power system states S1–S5. In this case, a low latency, low power state such as the ACPI S1 state is selected. A low latency, low power state maintains system context and allows a relatively rapid resumption of system execution. As such, complete re-initialization of components such as the memory subsystem 160 may not be feasible or desirable in a low latency, low power state.

Next, in block 205, memory control logic 135 places the memory subsystem 160 in a self-refresh mode. Since complete re-initialization may not be performed upon resumption from the low latency, low power state, the hardware maintains at least some of the configuration information determined at boot time as indicated in block 210. To maintain this information (typically stored in registers within the memory interface 110), power is maintained to the memory interface during the low latency, low power state. Additionally, as indicated in block 212, a bit may be set indicating which low power mode is being entered. The BIOS may indicate the power state by writing a value stored in the memory interface 110. In other embodiments, such a value may be set using other software or hardware techniques and may be located elsewhere, such as in the ICH 180. Additionally, the bit may be set in a different order with respect to other low power state entry operations so long as the bit is set before the low power state is actually entered.

The global clock and power unit 106 shuts down clocks in an appropriate order to prevent malfunctions. For example, global S1 state logic 108 may control gating of the clock to the CPU and/or the memory interface or other components. Glitches or other malfunctions may be avoided by gating clocks to, for example, the memory interface when a phase locked loop for the component is shut down. Additionally, prior to entry into the low power state, S1 messaging logic 184 may generate a message for the memory interface 110 to indicate that the memory interface 110 should flush any write buffers. This may alternatively be performed in conjunction with placing he memory in a self-refresh state (block 205), and may be sequenced differently in different embodiments. The memory interface 110 may then return a message via messaging logic 125 to the ICH 180 to indicate these operations are complete and that actual entry into the low latency low power state may now occur.

As indicated in block 215, the low latency, low power state is then entered. Again, the ACPI SI state is one example of an appropriate low latency, low power state. The system remains in the low latency, low power state until a wake-up event occurs as indicated in block 220. At this point, S1 exit detect logic 182 detects the low power state exit event which occurs as indicated in block 225. In response, S1 messaging logic 184 sends a message (e.g., S1 exit) via a bus 181 (e.g., a hub link bus) to the memory interface 110 as indicated in block 227.

S1 messaging logic 125 in the hub interface 102 receives and decodes the hub link S1 state exit message from the ICH 180 and responsively enables memory resume logic 130. The memory resume logic 130 sequences through a series of initialization commands to reinitialize the memory subsystem 160 as indicated in block 230. The memory control logic 135 may have a predefined set of instructions that it typically receives from software such as the BIOS. The memory resume logic 130 may sequence through an internally generated series of such commands in order to perform the proper initialization operations. Therefore, the memory resume logic 130 may emulate a software routine that initializes the memory control logic 135. The routine emulated may be a subset of the BIOS routine used at boot when the memory is first initialized or when another low power state is exited (e.g., the ACPI S3 state).

Since the memory resume logic 130 itself sequences through the series of initialization commands, interaction is not required from the processor 140 or the memory subsystem 160. Advantageously, this transparency allows complex initializations to be performed at a time when the memory subsystem is unavailable. Moreover, since states such as ACPI S1 typically resume directly to the operating system 170 (which is stored in the memory subsystem 160), this transparency may be required as there may be no other opportunity for the processor 140 to execute a code sequence prior to needing to access the memory subsystem 160.

For example, in a system which utilizes a Rambus® memory subsystem, putting the memory subsystem in a nap state or a powerdown state requires that certain initialization operations be performed prior to the memory subsystem resuming normal operations and returning any data from memory. Thus, if a system enters the ACPI S1 state and expects to exit by executing operating system code, the memory subsystem 160 will be unavailable to retrieve that operating system code. Thus, the intervention of hardware memory resume logic 130 may allow the ACPI S1 state to be used in a system with a Rambus® memory subsystem.

Figure 3:
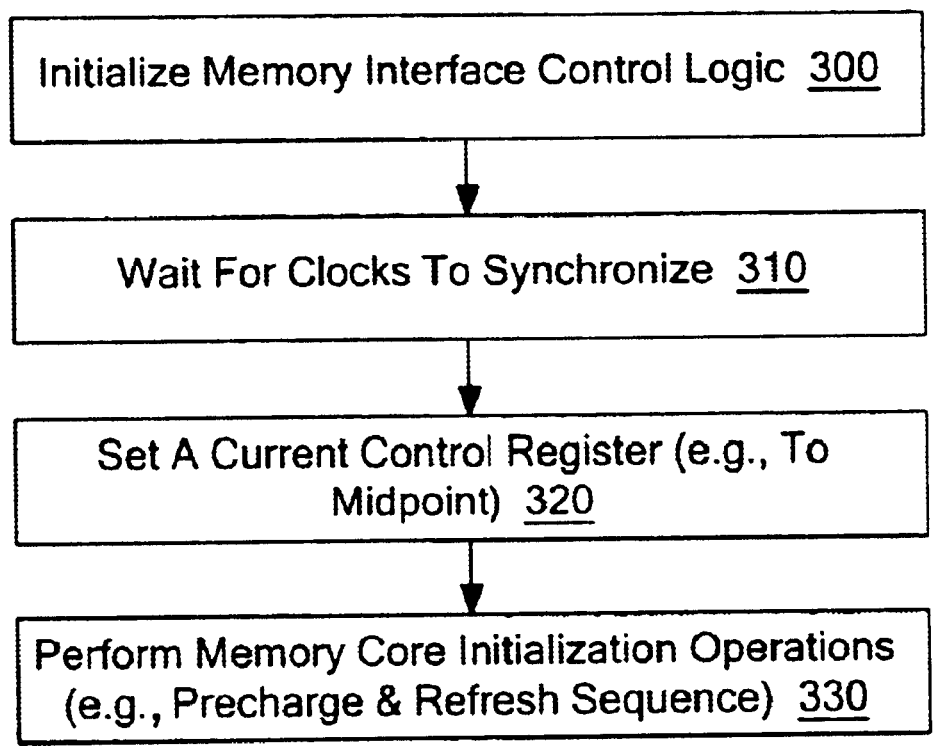
FIG. 3 illustrates additional details of initialization operations performed by one embodiment.

Details of the initialization operations performed in block 230 for one embodiment are shown in the flow diagram of FIG. 3. In block 300, the memory interface control logic is initialized by the memory resume logic 130. In the embodiment of FIG. 1, the memory interface control logic is the memory control logic 135. In embodiments utilizing a Rambus® memory subsystem, the memory control logic 135 may be a Rambus ASIC Cell (RAC) which may be initialized according to Rambus specifications (e.g., execute a RAC initialization operation and set control register values as needed). These operations are performed well after the appropriate clocks are running and stable. In block 310, the memory resume logic 130 sends a clock synchronization command and the system waits for memory subsystem clocks to synchronize. For example, the system may wait for the Direct Rambus Clock Generator (DRCG) to lock to the Clock To Memory (CTM) clock.

As indicated in block 320, the memory resume logic 130 sends a command to set a current control register to a predetermined value. For example, the current control register may be set to a midpoint value. A midpoint value may be appropriate since a low power state is being exited and complete re-calibration may be needed. The midpoint value advantageously limits the maximum number of adjustments that may need be made (maximum of one-half the total range in either up or down directions). As indicated in block 330, memory core initialization operations may then be performed. These may include a series of pre-charge and refresh operations as needed to restore the memory subsystem to normal operation.

Returning to FIG. 2, the memory interface 110 sends a message to the ICH 180 after the sequence of initialization operations has been completed as indicated in block 232. This message indicates that the memory interface has completed initialization operations and is prepared to resume normal operations. Accordingly, the ICH 180 deasserts the stop clock signal on the signal line 186 to the processor 140 as indicated in block 234. Then, as indicated in block 240, normal operation resumes, and the operating system or other software can resume execution of code stored in the memory subsystem 160.

Thus, a method and apparatus for resuming operations from a low latency wake-up low power state is disclosed. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. An apparatus comprising:
    a processor;
    an operating system to control a plurality of power management states, one of said power management states being a low latency low power state;
    a memory subsystem that requires initialization commands to exit a memory low power state;
    control logic to detect exiting of said low latency low power state and to responsively generate a plurality of initialization commands to remove said memory subsystem from said memory low power state prior to allowing execution of the processor to resume in response to a low power state exit message from a first component, said control logic further to generate an end of low power state exit message to the first component.

2. The apparatus of claim 1 wherein said low latency low power state is a state from which the apparatus resumes without executing BIOS routines.

3. The apparatus of claim 1 wherein the low latency low power state is an ACPI S1 state and wherein said memory low power stale is one of a nap state and a powerdown state.

4. The apparatus of claim 1 wherein said control logic comprises memory resume sequencing logic, further comprising:
    low power state exit detection logic.

5. The apparatus of claim 4 wherein said memory resume sequencing logic is to receive the low power state exit message as an indication of exiting the low latency low power state from the low power state exit detection logic and is to generate the end of low power state exit message to allow deassertion of a stop clock signal after said plurality of initialization commands have been executed by the memory resume sequencing logic.

6. The apparatus of claim 5 wherein said memory resume sequencing logic is included in a memory interface and said low power state exit detection logic is included in an I/O control hub (ICH), which is the first component, said apparatus further comprising:
    first messaging logic to transmit the low power state exit message to said memory interface;
    second messaging logic to transmit the end of low power state exit message back to said ICH after said memory interface completes said plurality of initialization commands in response to said low power state exit message.

7. The apparatus of claim 1 wherein said plurality of initialization commands comprises:
    initializing memory interface control logic;
    waiting for a clock circuit to lock;
    setting a current control register;
    performing memory core initialization operations.

8. The apparatus of claim 7 wherein setting the current control register comprises setting the current control register to a midpoint value.

9. The apparatus of claim 7 wherein performing memory core initialization operations comprises performing a sequence of pre-charge and refresh operations.

10. An apparatus comprising:
    messaging logic coupled to receive a low power state exit message from a first source;
    memory system resume logic coupled to receive said low power state exit message from said messaging logic, said memory system resume logic to sequence through a plurality of initialization commands prior to returning to the first source an end of low power state exit message subsequent to completion of said plurality of initialization commands by said memory system resume logic.

11. The apparatus of claim 10 further comprising:
    low power state exit detection logic to detect an exiting condition for one of a plurality of a low power states and to generate the low power state exit message.

12. The apparatus of claim 11 wherein the signal is a deassertion of a stop clock signal which is generated in response to said end of low power state exit message.

13. The apparatus of claim 12 wherein said low power state is an ACPI S1 state.

14. The apparatus of claim 10 wherein said plurality of initialization commands comprise:
    initializing memory interface control logic;
    waiting for a clock circuit to lock;
    setting a current control register;
    performing memory core initialization operations.

15. The apparatus of claim 14 wherein setting the current control register comprises setting the current control register to a midpoint value.

16. The apparatus of claim 14 wherein performing memory core initialization operations comprises performing a sequence of pre-charge and refresh operations.

17. A method comprising:
    detecting an event to cause an exit from a low latency low power state by receiving a resume message from a first message logic;
    initializing a memory subsystem transparently to execution resources of a processor that is starting operations in response to the exit from the low latency low power state;
    sending an initialization complete message to the first message logic;
    exiting the low latency low power state in response to a third message to the processor.

18. The method of claim 17 wherein initializing comprises:
    initializing memory interface control logic;
    waiting for a clock circuit to lock;
    setting a current control register;
    performing memory core initialization operations.

19. The method of claim 18 wherein setting the current control register comprises setting the current control register to a midpoint value.

20. The method of claim 18 wherein performing memory core initialization operations comprises performing a sequence of pre-charge and refresh operations.

21. The method of claim 17 wherein detecting comprises:
reading a bit set by BIOS upon entry into said low latency low power state;
sending the resume message from an I/O control hub to memory interface logic.

22. The method of claim 21 after initializing, further comprising:
returning the initialization complete message to the I/O control hub;
deasserting a stop clock signal.

23. The method of claim 17 wherein exiting the low latency low power state comprises deasserting a stop clock signal to a processor.

24. The method of claim 17 further comprising:
detecting a low power state entry condition;
setting a bit to indicate the low latency low power state is selected from a plurality of low power states.

25. A system comprising:
a processor;
a memory;
an input/output controller to generate a first low power message to signal an exit of a low power state and to send a second low power message to the processor;
a memory controller coupling the processor to the memory, the memory controller to receive the first low power message and to responsively generate a plurality of initialization commands for the memory and to generate a first responsive message to the input/output controller, the second low power message being sent to the processor by the input/output controller responsively to the first responsive message sent to the input/output controller from the memory controller.

26. The system of claim 25 wherein the processor and the memory controller are portions of an integrated processor device including both the processor and the memory controller.

27. The system of claim 25 wherein said low power state is a state from which the processor resumes without executing BIOS routines.

28. The system of claim 25 wherein said plurality of initialization commands comprises:
waiting for a clock circuit to lock;
setting a current control register to a midpoint value.

29. The system of claim 25 further comprising a BIOS routine to set a bit upon entry into the low power state.

30. The system of claim 29 wherein the bit is a bit written to in the memory controller.

31. The system of claim 30 wherein said low power state is a state from which the processor resumes without executing BIOS routines.

* * * * *